United States Patent [19]

Nagakawa et al.

[11] Patent Number: 5,309,005
[45] Date of Patent: May 3, 1994

[54] CHARGE TRANSFER DEVICE HAVING A BENT TRANSFER CHANNEL

[75] Inventors: Tadashi Nagakawa, Nabari; Kazuo Hashiguchi, Shiki, both of Japan

[73] Assignee: Sharp Kabushiki Kaisha, Osaka, Japan

[21] Appl. No.: 964,934

[22] Filed: Oct. 22, 1992

[30] Foreign Application Priority Data

Feb. 6, 1992 [JP] Japan .................................. 4-21090

[51] Int. Cl.$^5$ .................... H01L 29/796; G11C 19/28
[52] U.S. Cl. .................................. 257/239; 257/240; 257/248; 257/250; 377/60
[58] Field of Search .................... 257/239, 240; 377/60

[56] References Cited

U.S. PATENT DOCUMENTS

| 4,403,237 | 9/1983 | Ohkubo et al. | 357/24 |
| 4,660,064 | 4/1987 | Hamasaki | 257/239 |
| 4,698,656 | 10/1987 | Kamata | 257/239 |
| 4,903,098 | 2/1990 | Smit et al. | 257/241 |
| 4,993,053 | 2/1991 | Itoh et al. | 257/239 |
| 5,091,922 | 2/1992 | Uehira | 377/60 |
| 5,173,757 | 2/1992 | Miwada | 257/239 |

FOREIGN PATENT DOCUMENTS 54-84948 6/1979 Japan .
2-303135 12/1990 Japan .

OTHER PUBLICATIONS

Kinugawa, et al.–IEDM Technical Digest, pp. 581–584 (1985).

Primary Examiner—Gene M. Munson
Attorney, Agent, or Firm—David G. Conlin; George W. Neuner

[57] ABSTRACT

A charge transfer device has a transfer section for transferring a signal charge along a transfer channel, and a pickup section connected to the transfer section for converting the signal charge received from the transfer section to a voltage signal, both sections being formed on a substrate. The transfer channel is bent generally at a right angle between the transfer section and the pickup section.

5 Claims, 5 Drawing Sheets

CHARGE TRANSFER DEVICE HAVING A BENT TRANSFER CHANNEL

BACKGROUND OF THE INVENTION

1. Field of the Invention

The present invention relates to a charge transfer device (CTD) for use in solid-state image pickup devices, delay lines, and the like.

2. Description of the Prior Art

An example of currently available charge transfer devices (CTD) for use in a solid-state image pickup device is shown in FIG. 3. This charge transfer device has a transfer section 101, a pickup section 102, and an amplification section 103, all provided on a substrate 100. Transfer gates G1-G4 at the stages of the transfer section 101 are driven by two-phase clocks $\phi_1$, $\phi_2$ applied thereto alternately from external and transfer a signal charge along a linear transfer channel X—X' toward the pickup section 102. In the figure, the hatched portions represent barrier regions which function to determine the direction in which the signal charge is transferred. The signal charge deriving from the transfer section 101 passes under an output gate OG, to which a DC voltage Vog is being applied, and enters a floating diode FD, which constitutes the pickup section 102. Then a potential change of the floating diode FD corresponding to an amount of the signal charge is transferred to the amplification section 103. The amplification section 103, made up of MOS transistors $Tr_1$, $Tr_2$, $Tr_3$, and $Tr_4$ provided between the power supply OD and ground, amplifies the voltage signal coming from the floating diode FD and provides its output signal OS to a connecting point of the MOS transistors $Tr_2$ and $Tr_3$. It is noted that the floating diode FD is periodically restored to a specified reset potential $V_{RD}$ when a clock $\phi r$ (to be applied synchronously with the two-phase clocks $\phi_1$, $\phi_2$) is applied to a reset gate RG from external of the device.

As is known, to enhance the charge-to-voltage conversion factor of the floating diode FD, it is desirable to reduce the area of the floating diode FD to thereby reduce its electrostatic capacity. In the conventional device, the width of the transfer channel X—X' is narrowed below the output gate OG connecting the transfer section 101 and the pickup section 102, and the area of the floating diode FD is reduced accordingly.

However, the conventional charge transfer device has the following drawback. That is, since the width of the linear transfer channel X—X' is merely narrowed, there arises a potential barrier 20 slanted in such a direction as will obstruct the transfer, to the width-narrowed point (i.e., below the output gate OG), as shown in FIG. 2 (a) during the charge transfer. This potential barrier 20 causes some transfer fault and, especially when the charge transfer device is used in a solid-state image pickup device, adversely affects its characteristic for low illuminance.

SUMMARY OF THE INVENTION

The object of the present invention is therefore to provide a charge transfer device capable of not only enhancing the charge-to-voltage conversion factor by reducing the area of the pickup section but also eliminating the possibility of occurrence of transfer faults.

In order to accomplish the above object, the present invention provides a charge transfer device which has on a substrate a transfer section having a plurality of transfer gates for transferring a signal charge along a transfer channel in a specified direction, and a pickup section operatively connected to the transfer gate of a final stage of the transfer section for converting the signal charge received from the transfer section to a voltage signal, wherein the transfer channel is bent generally at a right angle between the transfer section and the pickup section.

Due to the fact that the transfer channel is bent generally at a right angle between the transfer section and the pickup section, even if the width of the transfer channel is narrowed at the point where the transfer channel is bent, there will arise no potential barrier that prevents the charge from moving toward the pickup section. Possible slanting of the potential as expected from the narrowed width of the transfer channel will occur rather in such a direction as to accelerate the transfer. Accordingly, there will no longer arise a potential barrier to the transfer channel, so that the possibility of transfer faults occurring is eliminated. Yet the width of the transfer channel can be set narrow at the point where the transfer channel is bent, independently of the width of the transfer channel on the transfer section side. As a result, the area of the pickup section is reduced more than ever, allowing the charge-to-voltage conversion factor to be further enhanced.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
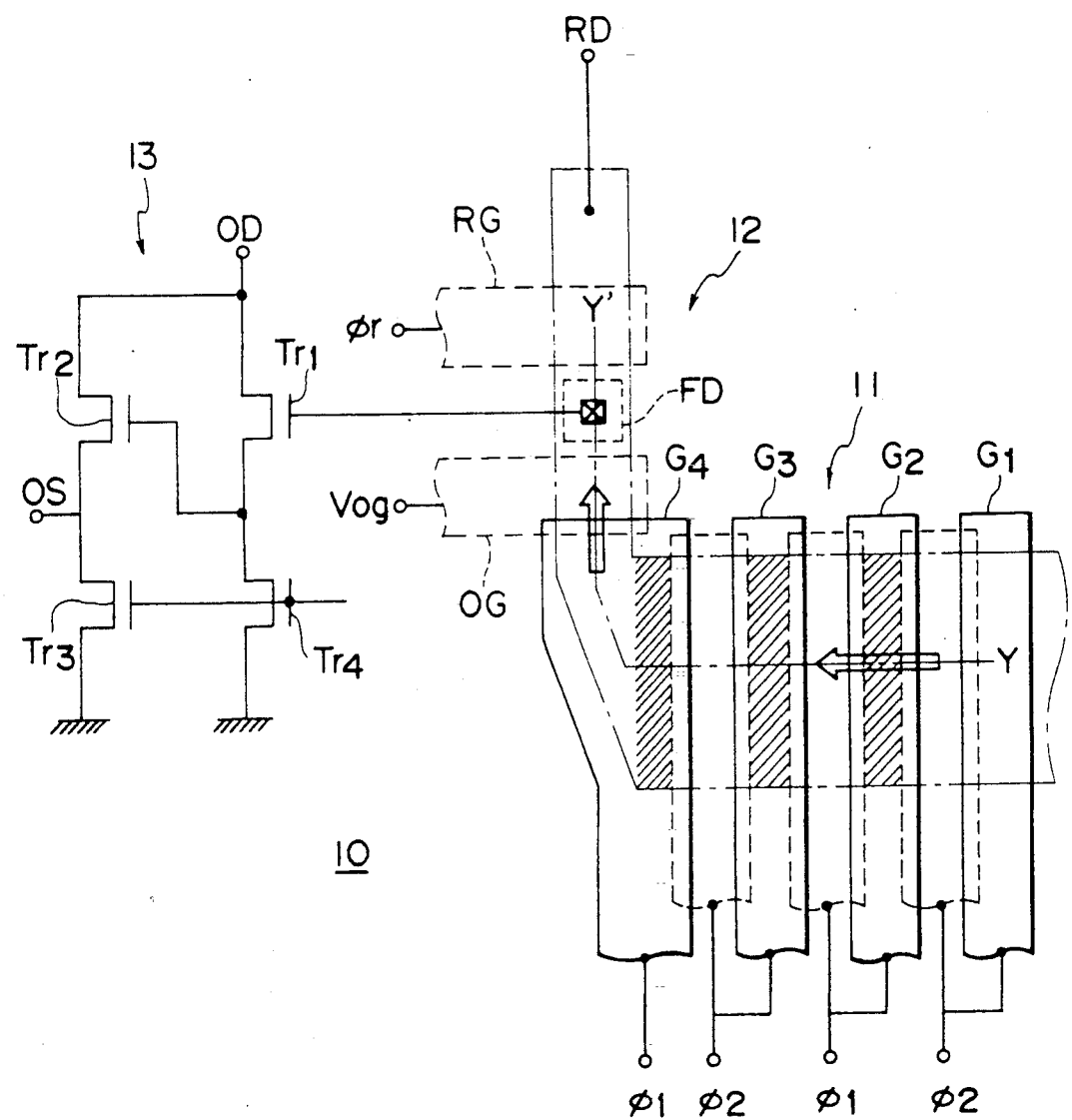
FIG. 1 shows the construction of a charge transfer device of an embodiment according to the present invention.

The charge transfer device of the present invention is described below in more detail with reference to an embodiment thereof as illustrated in FIG. 1.

As shown in FIG. 1, the charge transfer device has a transfer section 11, a pickup section 12, and an amplification section 13, all provided on a substrate 10.

The transfer section 11 has transfer gates $G_1$-$G_4$. The transfer gates $G_1$-$G_4$ at the stages of the transfer section 11 are driven by the two-phase clocks $\phi_1$, $\phi_2$ applied thereto alternately from external to transfer a signal charge along a transfer channel Y—Y' to the pickup section 12. As illustrated, the transfer channel Y—Y' is bent perpendicularly between he transfer section 11 and the pickup section 12, and more specifically at the final stage $G_4$ of the transfer section 11, in this example. The width of the transfer channel Y—Y' is narrowed also at this point $G_4$, so that the width of a part of the transfer channel on the transfer section 11 side is narrower than that of a part thereof on the pickup section 12 side. The hatched portions in the figure represent barrier regions which function to determine the direction in which the signal charge is transferred.

The signal charge transferred from the transfer section 11 passes under an output gate OG, to which a DC voltage Vog is being applied, and enters a floating diode FD. In this embodiment, the output gate OG and the floating diode FD constitute the pickup section 12. Then the floating diode FD generates a voltage corresponding to an amount of the signal charge. Based on the fact that the width of the bent transfer channel Y—Y' is narrowed at, or more precisely, below the final stage $G_4$ of the transfer section 11, the floating diode FD can be reduced to a small area so that the charge-to-voltage conversion factor can be set high. The floating diode FD is periodically restored to the reset potential $V_{RD}$ when the clock $\phi r$ (to be applied synchronously with the two-phase clocks $\phi 1$, $\phi 2$) is applied to a reset gate RG from external of the device, as in the conventional device.

In this case, the output gate OG and the reset gate RG are arranged generally perpendicularly to the transfer gates $G_1$-$G_4$.

An electric potential change of the floating diode FD is transferred to the amplification section 13. The amplification section 13, made up of MOS transistors $Tr_1$, $Tr_2$, $Tr_3$, and $Tr_4$ provided between the power supply OD and ground, amplifies the voltage signal received from the floating diode FD and provides its output signal OS to a connecting point of the MOS transistors $Tr_2$ and $Tr_3$, as in the prior art device.

Figure 2:
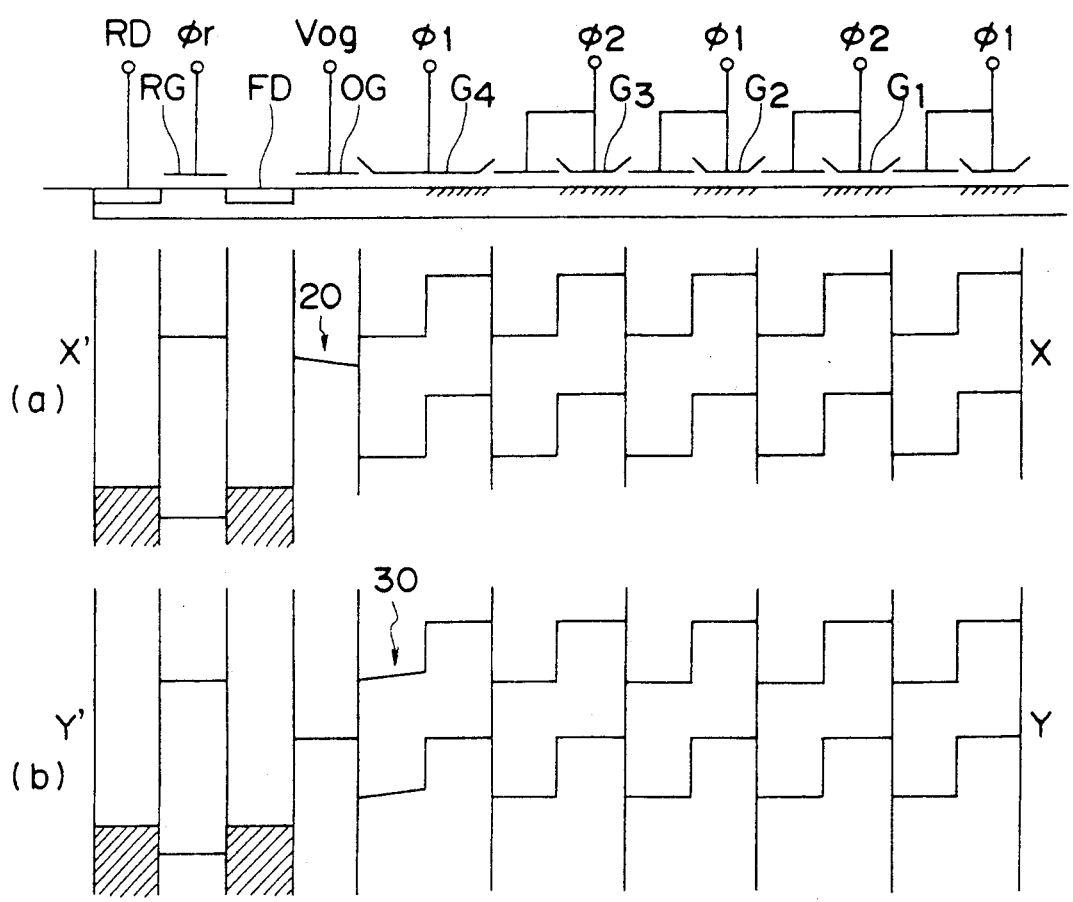
FIG. 2 shows potential distributions which the charge transfer device of FIG. 1 and the conventional charge transfer device of FIG. 3 respectively have when the charge transfer is effected.
Figure 3:
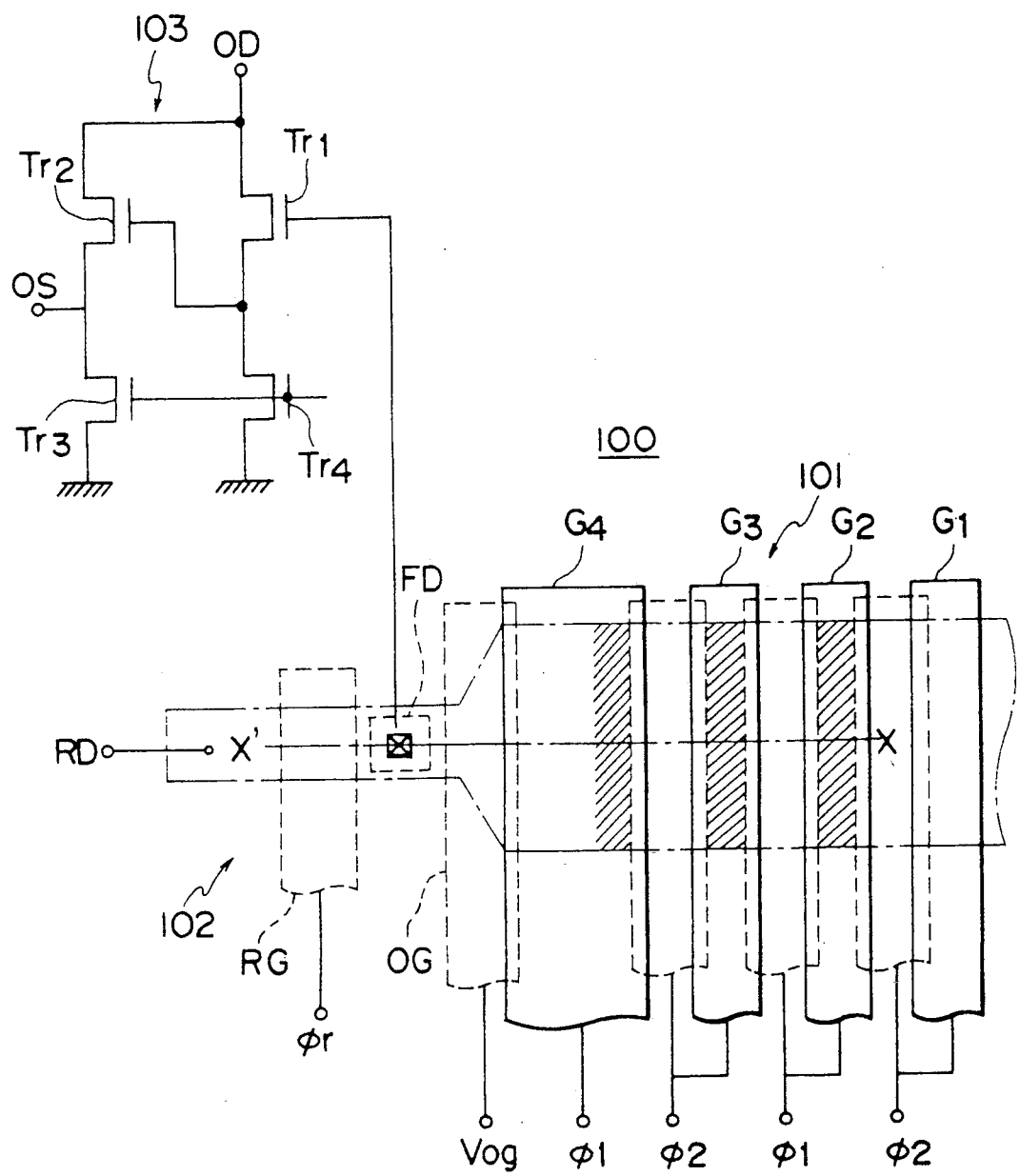
FIG. 3 shows the construction of the conventional charge transfer device.

As described above, this charge transfer device has the transfer channel Y—Y' which is bent generally at a right angle between the transfer section 11 and the pickup section 12. Therefore, even if the width of the transfer channel Y—Y' is narrowed at the bending or turning point thereof, any potential barrier can be prevented from arising to the transfer channel Y—Y' as shown in FIG. 2 (b), thus eliminating the possibility of the occurrence of transfer faults. Rather, the potential change (slanting 30 of the potential) as expected from the narrowed width of the transfer channel will arise in such a direction as to accelerate the transfer, as illustrated in FIG. 2 (b). Also, since the transfer channel Y—Y' is bent between the transfer section 11 and the pickup section 12, the width of the transfer channel Y—Y' in the pickup section 12 can be set independently of the width of up to the final stage of the transfer section. Therefore, the area of the floating diode FD can be further reduced, allowing the charge-to-voltage conversion factor to be further increased.

Figure 4:
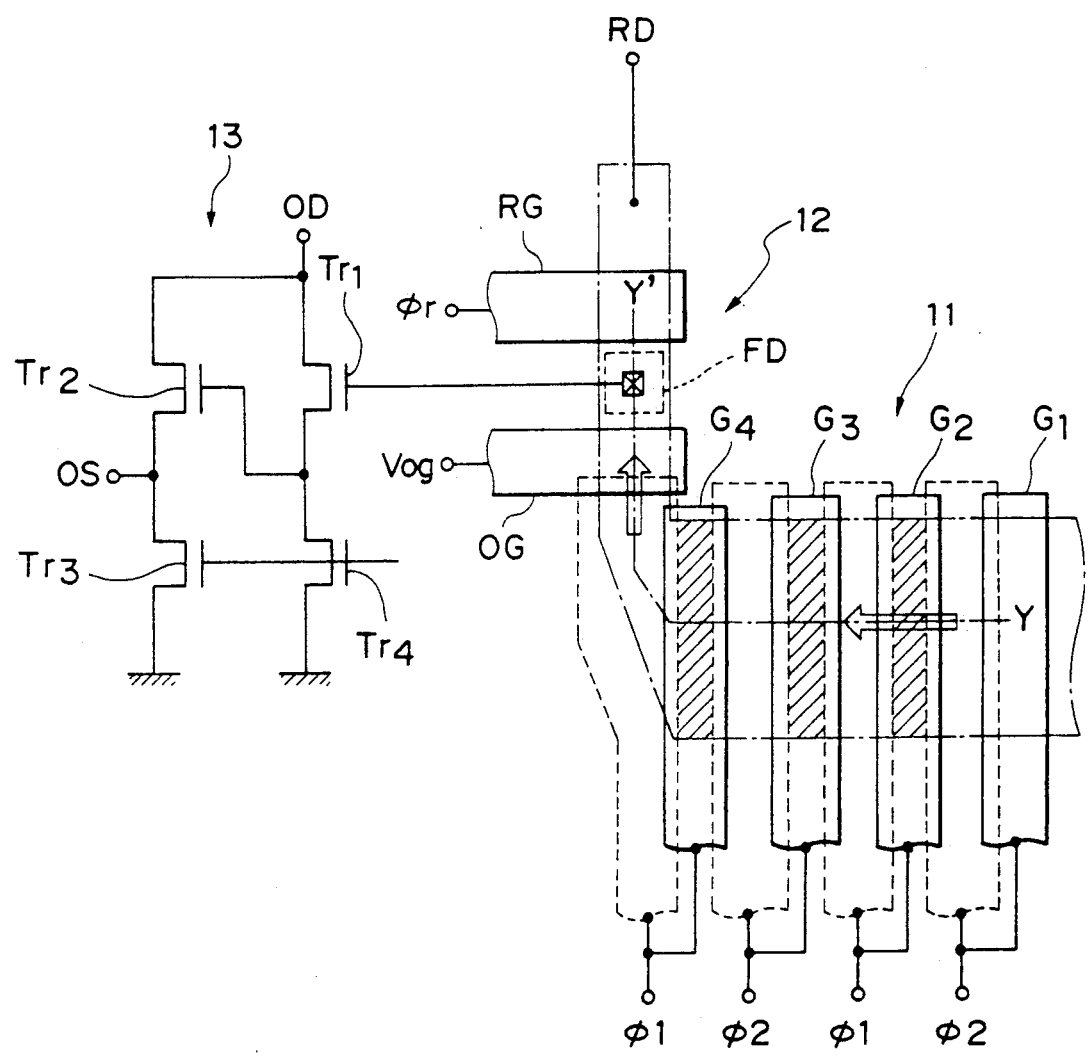
FIG. 4 shows a variant of the charge transfer device of FIG. 1.

In the embodiment of FIG. 1, the transfer gates $C_1$-$G_3$ of the transfer section 11 are double-layered and the transfer gate $G_4$, at which the transfer channel Y—Y' is turned, is single-layered. However, the transfer gate $G_4$ may be also double-layered as shown in FIG. 4.

Figure 5:
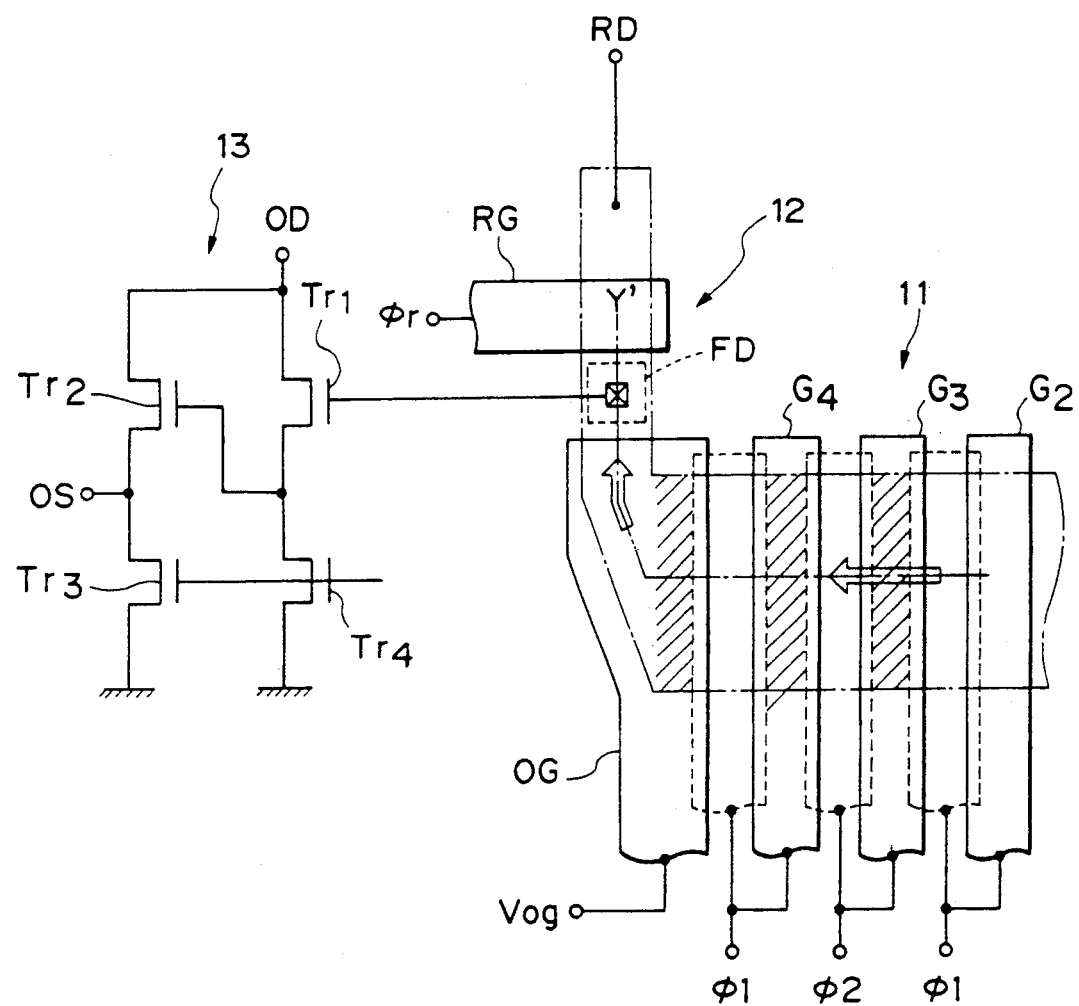
FIG. 5 shows another variant of the charge transfer device of FIG. 1.

Moreover, in the embodiment of FIG. 1, the direction in which the output gate OG extends is perpendicular to the direction in which the transfer gates $G_1$-$G_4$ extend, and the transfer channel Y—Y' is bent below the final transfer gate $G_4$. However, this structure can be changed as shown in FIG. 5, where the direction in which the output gate OG extends is parallel with the direction in which the transfer gates extend, and the transfer channel Y—Y' is bent at the output gate OG. In the variant of FIG. 5, the output gate OG is included in the transfer section 11.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A charge transfer device having, on a substrate, a transfer section having a plurality of transfer gates for transferring a signal charge along a transfer channel in a specified direction, and a pickup section operatively connected to the transfer gate of a final stage of the transfer section for converting the signal charge received from the transfer section to a voltage signal, characterized in that the transfer channel is bent generally at a right angle between the transfer section and the pickup section; wherein the transfer channel is narrowed in a position in which the transfer channel is bent so that a part of the transfer channel located in the pickup section has a width narrower than that of a part thereof located in the transfer section.

2. The charge transfer device as claimed in claim 1, wherein an output gate is included in the pickup section and the transfer channel is bent at the transfer gate of the final stage.

3. The charge transfer device as claimed in claim 2, wherein the transfer gate of the final stage of the transfer section is single-layered.

4. The charge transfer device as claimed in claim 2, wherein the transfer gate of the final stage of the transfer section is double-layered.

5. The charge transfer device as claimed in claim 1, wherein an output gate is included in the transfer section and the transfer channel is bent at the output gate.

* * * * *